United States Patent
Kawaguchi et al.

(10) Patent No.: US 9,214,788 B2
(45) Date of Patent: Dec. 15, 2015

(54) SEMICONDUCTOR LIGHT EMITTING ELEMENT

(71) Applicant: Panasonic Intellectual Property Management Co., Ltd., Osaka (JP)

(72) Inventors: Masao Kawaguchi, Osaka (JP); Hideki Kasugai, Shiga (JP); Shinichiro Nozaki, Kyoto (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/579,593

(22) Filed: Dec. 22, 2014

(65) Prior Publication Data

US 2015/0146756 A1 May 28, 2015

Related U.S. Application Data

(63) Continuation of application No. PCT/JP2013/003336, filed on May 27, 2013.

(30) Foreign Application Priority Data

Jul. 6, 2012 (JP) .................................. 2012-152454

(51) Int. Cl.
*H01S 5/00* (2006.01)
*H01S 5/34* (2006.01)
(Continued)

(52) U.S. Cl.
CPC .............. *H01S 5/3425* (2013.01); *B82Y 20/00* (2013.01); *H01L 33/04* (2013.01);
(Continued)

(58) Field of Classification Search
CPC ......... H01L 33/04; H01L 33/10; H01L 33/32; H01S 5/3425; H01S 5/18361; H01S 5/2031; H01S 5/34333; H01S 5/022; H01S 5/18305; B82Y 20/00
See application file for complete search history.

(56) References Cited

U.S. PATENT DOCUMENTS

| 7,609,745 | B2 | 10/2009 | Takeuchi |
| 2008/0056320 | A1 | 3/2008 | Takeuchi |
| 2010/0265976 | A1* | 10/2010 | Bousquet et al. .......... 372/44.01 |

FOREIGN PATENT DOCUMENTS

| JP | 3299739 B2 | 7/2002 |
| JP | 2008-060459 A | 3/2008 |
| JP | 2012-104764 A | 5/2012 |

OTHER PUBLICATIONS

E. L. Waldron et al., "Experimental study of perpendicular transport in weakly coupled AlxGa1—xN/GaN superlattices," Applied Physics Letters, vol. 83, No. 24, Dec. 15, 2003, pp. 4975-4977.
(Continued)

*Primary Examiner* — Yuanda Zhang
(74) *Attorney, Agent, or Firm* — McDermott Will & Emery LLP

(57) ABSTRACT

A semiconductor light emitting element includes an n-type light guide layer containing a group III nitride semiconductor, an active layer, and a p-type light guide layer, in which the n-type light guide layer includes a semiconductor superlattice layer which is a stack of superlattice layers, the semiconductor superlattice layer having a structure in which group III nitride semiconductors A and group III nitride semiconductors B are alternately stacked, each of the semiconductors A and each of the semiconductors B being stacked in each of the superlattice layers, a relationship Eg (A)>Eg (B) holds, the semiconductor A is a film containing AlInN, and the film contains oxygen (O) at a concentration of at least $1 \times 10^{18}$ cm$^{-3}$, the semiconductor A has a film thickness of at most 5 nm, and a current is injected in a stacking direction of the superlattice layers.

7 Claims, 11 Drawing Sheets

(51) Int. Cl.
  H01L 33/04    (2010.01)
  H01S 5/20     (2006.01)
  H01S 5/343    (2006.01)
  B82Y 20/00    (2011.01)
  H01S 5/32     (2006.01)
  H01L 33/10    (2010.01)
  H01L 33/32    (2010.01)
  H01S 5/022    (2006.01)
  H01S 5/183    (2006.01)

(52) U.S. Cl.
  CPC .......... *H01S 5/18361* (2013.01); *H01S 5/2031* (2013.01); *H01S 5/3216* (2013.01); *H01S 5/34333* (2013.01); H01L 33/10 (2013.01); H01L 33/32 (2013.01); H01S 5/022 (2013.01); H01S 5/18305 (2013.01)

(56) References Cited

OTHER PUBLICATIONS

R. B. Chung et al., "Growth study and impurity characterization of AlxIn1—xN gown by metal organic chemical vapor deposition," Journal of Crystal Growth, vol. 324, Apr. 27, 2011, pp. 163-167.

R. B. Chung et al., "Temperature Dependent Capacitance—Voltage Analysis of Unintentionally Doped and Si Doped AI0.82In0.18N Grown on GaN," Japanese Journal of Applied Physics, vol. 50 (2011), pp. 101001-1-101001-4.

H. Kim-Chauveau et al., "Growth optimization and characterization of lattice-matched AI0.82In0.18N confinement layer for edge emitting nitride laser diodes," Journal of Crystal Growth, vol. 338, Oct. 17, 2011, pp. 20-29.

R. Charash et al., "Cleaved-facet violet laser diodes with lattice matched AI0.82In0.18N/GAN multilatyers as n-cladding," Applied Physics Letters, vol. 98, May 19, 2011, p. 201112-1-201112-3.

E. Feltin et al., "GaN-based laser diodes including lattice-matched AI0.83In0.17N cladding layer," Proce of CLEO/IQEC978-1-55752-869-8/09 CTuY5, 2009.

International Search Report issued in International Application No. PCT/JP2013/003336 dated Jul. 16, 2013, with English translation.

\* cited by examiner

101

102

SEMICONDUCTOR LIGHT EMITTING ELEMENT

CROSS REFERENCE TO RELATED APPLICATIONS

This is a continuation application of PCT International Application No. PCT/JP2013/003336 filed on May 27, 2013, designating the United States of America, which is based on and claims priority of Japanese Patent Application No. 2012-152454 filed on Jul. 6, 2012. The entire disclosures of the above-identified applications, including the specifications, drawings and claims are incorporated herein by reference in their entirety.

FIELD

The present disclosure relates to a semiconductor light emitting element including a group III nitride represented by gallium nitride (GaN).

BACKGROUND

Because of their excellent features such as a small size, a reasonable price, and a high output, semiconductor lasers are used in many technical fields ranging from, for example, the IT technology such as communications and optical disks to the medical field to part of the illumination technology. Semiconductor light sources (semiconductor light emitting elements) having a wavelength of 450 nm to 540 nm and using GAN semiconductor lasers have been developed in recent years to be available for use in light sources of display devices such as a laser display and a backlight liquid crystal display (LCD).

It is important for the semiconductor light emitting elements used in these display devices to output a higher output of light to obtain a clear image. Moreover, reduction of power consumption is required to simplify and reduce the cost of a heat-dissipation mechanism of a display device and improve the reliability of the semiconductor light emitting element itself.

In a semiconductor light emitting element such as a semiconductor laser, a decrease of a threshold value can increase a light output obtained for the same injection current value, thereby achieving a higher light output and a lower current. This can reduce power consumed by the semiconductor light emitting element.

To increase a parameter called vertical optical confinement factor (Γv) is known as a way to decrease a threshold value in the semiconductor laser. Moreover, in many cases, InGaN or GaN is used for a light guide layer and AlGaN having a lower refractive index than InGaN and GaN is used for a clad layer, in a group III nitride semiconductor laser using a general n-type GaN substrate.

To lower the refractive index of the clad layer to improve the vertical optical confinement factor (Γv), use of AlInN having a very low refractive index for the n-type clad layer is disclosed, for example (non patent literature 1 (NPL 1)). Moreover, a test was conducted in which n-GaN layers were regularly formed in an AlInN layer and electricity was conducted in a stacking direction of layers (non patent literature 2 (NPL 2)).

CITATION LIST

Non Patent Literature

[NPL 1] E. Feltin, A. Castiglia, G. Cosendey, J.-F. Carlin, R. Butte, and N. Grandjean Proc. of CLEO/IQEC978-1-55752-869-8/09 CTuY5, 2009.

[NPL 2] R. Charash, H. Kim-Chauveau, J-M. Lamy, M. Akther, P. P. Maaskant, E. Frayssinet, P. de Mierry, A. D. Drager, J-Y. Duboz, A. Hangleiter, and B. Corbett, APPLIED PHYSICS LETTERS 98, 201112, 2011.

SUMMARY

Technical Problem

In the semiconductor light emitting element disclosed in NPL 1, AlInN is used to lower the refractive index of an n-type clad layer. However, in the use of AlInN, there is the problem that it is difficult to inject electrons by passing the electrons through AlInN in a stacking direction of layers.

To address this problem, NPL 1 introduces the structure in which electrons are injected with a thin n-type AlGaN layer being between a light guide layer and an AlInN clad layer. The electrons, however, pass through the AlGaN layer in a lateral direction, resulting in high resistance. Thus, achieving a low voltage element is difficult.

Meanwhile, in a test in NPL 2, n-GaN layers were regularly formed in an AlInN layer and electricity was conducted in a stacking direction of layers. However, electrical properties of practical use level have yet to be obtained.

Moreover, whether a distributed Bragg reflector (DBR) using GaN and AlGaN is to be used in a group III nitride surface emitting laser is under consideration. However, a large difference in lattice constant is present between GaN and AlGaN. Therefore, there is the problem that it is difficult to increase the ratio of Al to the composition of AlGaN to increase a refractive index difference, thereby increasing the refractive index of the DBR. In view of this, use of AlInN for a low refractive index layer of the DBR is also under consideration. However, a surface emitting laser using AlInN for a DBR layer has not been reported. This is because it is difficult to inject electrons by passing the electrons through an AlInN layer in a stacking direction of layers.

In view of the above problems, the present disclosure provides a semiconductor light emitting element whose emission efficiency can be improved by effectively increasing the vertical optical confinement factor Γv of the semiconductor light emitting element and decreasing a lasing threshold current.

Solution to Problem

To solve the above problems, a semiconductor light emitting element according to the present disclosure includes an n-type layer containing a group III nitride semiconductor, an active layer, and a p-type layer, in which the n-type layer includes a semiconductor superlattice layer which is a stack of superlattice layers, the semiconductor superlattice layer having a structure in which group III nitride semiconductors A and group III nitride semiconductors B are alternately stacked, each of the group III nitride semiconductors A and each of the group III nitride semiconductors B being stacked in each of the superlattice layers, a relationship Eg (A)>Eg (B) holds, where Eg (A) denotes a band gap of the group III nitride semiconductor A, and Eg (B) denotes a band gap of the group III nitride semiconductor B, the group III nitride semiconductor A is a film containing AlInN, and the film contains oxygen (O) at a concentration of at least $1\times10^{18}$ cm$^{-3}$, the group III nitride semiconductor A has a film thickness of at most 5 nm, and a current is injected in a stacking direction of the superlattice layers.

Additional benefits and advantages of the disclosed embodiments will be apparent from the Specification and Drawings. The benefits and/or advantages may be individually obtained by the various embodiments and features of the Specification and Drawings, which need not all be provided in order to obtain one or more of such benefits and/or advantages.

Advantageous Effects

According to the present disclosure, the emission efficiency of a semiconductor light emitting element can be improved by effectively increasing the vertical optical confinement factor Γv of the semiconductor light emitting element and decreasing a lasing threshold current.

BRIEF DESCRIPTION OF DRAWINGS

These and other advantages and features will become apparent from the following description thereof taken in conjunction with the accompanying Drawings, by way of non-limiting examples of embodiments disclosed herein

DESCRIPTION OF EMBODIMENT(S)

Figure 1A:
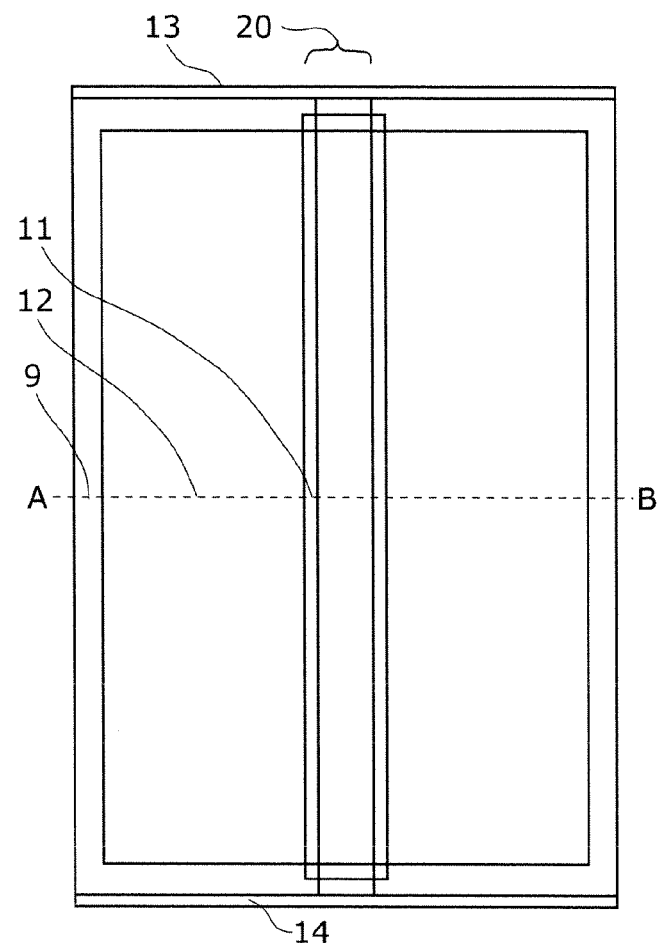
FIG. 1A is a top view of a semiconductor light emitting element according to Embodiment 1.

(Underlying Knowledge Forming Basis of the Present Disclosure)

The following describes underlying knowledge forming the basis of the present disclosure with reference to the drawings.

In a semiconductor light emitting element such as a semiconductor laser, there are a region in which a current injection only gradually increases a light output (a region with a small current value) and a region in which a current injection significantly increases a light output (a region with a large current value). A current value at the boundary between the regions is referred to as a threshold value. A decrease of the threshold value can decrease the region in which the current injection only gradually increases the light output. This can increase a light output obtained for the same injection current value. That is, the decrease of the threshold value can improve an output. Moreover, the decrease of the threshold value can decrease a current value necessary for obtaining a particular light output and reduce power consumption. As a result, cost reduction and a longer life can be achieved.

Meanwhile, to increase a parameter called vertical optical confinement factor (Γv) is known as a way to decrease the threshold value of the semiconductor laser. This is because a light amplification performance of the semiconductor laser called a mode gain is expressed by the product of the vertical optical confinement factor (Γv) and a material gain (g), i.e., Γv×g. Here, the material gain (g) denotes an amplification degree when a laser beam travels through a light emitting layer (called active layer).

The semiconductor laser lases when the mode gain is identical to a loss (α) of a laser resonator. A large vertical optical confinement factor Γv can decrease the threshold value with the following reason. Although g monotonously increases with a current injection, other parameters have constant values. Thus, the larger the vertical optical confinement factor Γv is, the smaller a current value i in the expression of Γv×g(i)=α is.

Here, the vertical optical confinement factor Γv is a ratio of the light emitting layer (called active layer) of the semiconductor laser to light distribution of light propagating in a direction perpendicular to stacked planes in the stacked structure of the semiconductor laser. The vertical optical confinement factor Γv often takes a value of a small percent. In a general stacked structure of the semiconductor laser, the active layer is vertically sandwiched between a p-type light guide layer and an n-type light guide layer. Moreover, the light guide layers are vertically sandwiched between a p-type clad layer and an n-type clad layer. Here, the light guide layer and the active layer function as regions which propagate a laser beam, and the regions need to have a higher refractive index than the clad layer.

This is to confine light in a high refractive index layer by sandwiching the high refractive index layer between low refractive index layers as light is concentrated on a high refractive index material. In such a stacked structure, to increase the vertical optical confinement factor Γv, it is necessary to strengthen the light intensity of the active layer normally disposed between the light guide layers. A particularly effective way to achieve this is to increase a refractive index difference between the light guide layer and the clad layer by decreasing the refractive index of the clad layer.

Moreover, a group III nitride vertical resonator surface light emitting semiconductor laser (hereinafter, simply referred to as surface light emitting laser) is attracting attention which operates in a visible light wavelength range and has the features that the laser can operate at a low threshold value and an emission beam shape can be easily controlled.

In the surface light emitting laser, two reflecting mirrors having a high reflectance close to 99% on stacked planes are provided, and the light emitting layer (active layer) is sandwiched between the two reflecting mirrors. Distributed Bragg reflectors (DBR), each of which is a stack of alternately-formed two kinds of materials having different refractive indices, are used as the reflecting mirrors.

Here, preferably, an electro-conductive material should be used as the material of the DBR to allow a current to be injected in a vertical direction (a direction perpendicular to the stacked planes). Many of the available surface emitting lasers having an infrared wavelength and using GaAs for substrates use n-type doped or p-type doped GaAs and AlAs or n-type doped or p-type doped GaAs and AlGaAs, as the material of the DBR. This is because AlAs and GaAs not only have a large refractive index difference while having substantially the same lattice constant, but also have the excellent feature that electricity can be conducted by doping impurities.

At present, in many cases, InGaN or GaN is used for a light guide layer and AlGaN having a lower refractive index than InGaN and GaN is used for a clad layer in a group III nitride semiconductor laser using a general n-type GaN substrate. It should be noted that to lower the resistance of p-AlGaN having a relatively high electrical resistance, a periodic structure of p-AlGaN/p-GaN superlattice is generally used in the p-type clad layer.

In the above structure, to lower the refractive index of the clad layer to increase the vertical optical confinement factor Γv can be relatively easily achieved by increasing the ratio of Al to AlGaN contained in the clad layer. However, a lattice constant difference from an n-type GaN substrate increases with an increase of the ratio of Al to AlGaN, leading to the defect that a clack is likely to be caused in the stacked structure. It is practically difficult to form the clad layer with AlGaN where Al occupies more than 10% of the composition.

The above problem is common to p-type and n-type clad layers using AlGaN, and this problem has become more noticeable in the n-type clad layers as high-quality n-type bulk substrates have been commercially available in recent years. The following describes the reason for this. When a group III nitride semiconductor laser is formed on an n-type GaN substrate, an n-type clad layer, a light guide layer (including an active layer), and a p-type clad layer are formed in the stated order. The n-type substrate has a higher refractive index than the n-type clad layer. This means that if the n-type clad layer does not have a sufficient film thickness, a laser beam emitted from the light guide layer may pass through the n-type clad layer to the n-type GaN substrate. This may cause an optical loss. Thus, the n-type clad layer needs to be thicker than the p-type clad layer.

In view of this, AlInN, which has a very small refractive index while having the same lattice constant as GaN, has been suggested to be used for the n-type clad layer (NPL 1). Moreover, in a test, n-GaN layers were periodically formed in the AlInN layer, and electricity was conducted in a stacking direction of layers (NPL 2).

As described above, NPL 1 uses AlInN to lower the refractive index of the n-type clad layer. However, AlInN has a very large band gap of approximately 5 eV, and has a band offset of around 1 eV for GaN on a conduction band side in the electronic structure (band). Thus, there is the problem that it is difficult to inject electrons by passing the electrons through AlInN in the stacking direction. To address the problem, NPL 1 introduces the structure in which a thin n-type AlGaN layer is provided between the light guide layer and the AlInN clad layer and electrons are injected to traverse the n-type AlGaN layer (in an in-plane direction of a stacked plane). However, as the electrons laterally pass through the AlGaN layer, the resistance is high. Thus, it has been difficult to realize a commercially-usable low voltage element. Meanwhile, in the test in NPL 2, the n-GaN layers were periodically formed in the AlInN layer, and electricity was conducted in the stacking direction. However, practically-usable electrical properties have yet to be obtained.

Moreover, whether a DBR using GaN and AlGaN is to be used in the group III nitride surface emitting laser is under consideration. However, unlike the described combination of GaAs and AlAs, a large lattice constant difference is present between GaN and AlGaN. Thus, it is difficult to increase a refractive index difference by increasing the ratio of Al to AlGaN to increase the reflectance of the DBR. In view of this, use of AlInN for the low refractive index layer of the DBR has been also under consideration. However, as described above, because of its difficulty of injecting electrons by passing the electrons through the AlInN layer in the stacking direction, a surface emitting laser using AlInN for a DBR layer has not been reported.

The following describes a semiconductor light emitting element whose emission efficiency can be improved by effectively increasing the vertical optical confinement factor Γv of the semiconductor light emitting element and reducing a lasing threshold current.

To address the above problems, in the present disclosure, an n-type clad layer is a semiconductor superlattice layer in which a stack of an AlInN layer doped with oxygen (O) as an impurity and other n-type group III nitride semiconductor layer is repeatedly formed at a short period of several nm. It should be noted that in the present disclosure, a semiconductor layer doped with oxygen (O) is expressed as, for example, AlInN (O).

After various analyses, the inventors of the present invention et al. have found reasons why a sufficient low resistance characteristic is not obtained in NPL 2. The reasons are described below. A superlattice period is not optimized. In addition, a Schottky barrier is formed due to quantized energy in a superlattice structure, and electricity is not conducted unless electrical bias is applied to overcome the Schottky barrier. This increases a resistance value.

In view of the above, the inventors of the present invention et al. have found the following things. When an AlInN film is doped with oxygen (O) as an impurity, the AlInN film has an impurity level having substantially the same energy as the donor level of other n-type group III nitride semiconductor (e.g., n-type GaN). The Schottky barrier is overcome by electrons being conducted while hopping the impurity level, which achieves a low resistance characteristic equivalent to that of a conventional AlGaN material.

Furthermore, the inventors et al. experimentally made group III nitride semiconductor lasers in which n-type clad layers contain the AlInN doped with oxygen (O), effectively increased the vertical optical confinement factor Γv of a semiconductor light emitting element while the electrical resistance of the clad layers containing AlInN doped with (O) is equivalent to the electrical resistance of an n-clad layer containing a conventional AlGaN material, and experimentally confirmed a decrease of a lasing threshold current. This allowed the inventors et al. to confirm that the emission efficiency of the semiconductor light emitting element can be improved.

Thus, a semiconductor light emitting element according to the present disclosure includes an n-type layer containing a group III nitride semiconductor, an active layer, and a p-type layer, in which the n-type layer includes a semiconductor superlattice layer which is a stack of superlattice layers, the semiconductor superlattice layer having a structure in which group III nitride semiconductors A and group III nitride semiconductors B are alternately stacked, each of the group III nitride semiconductors A and each of the group III nitride semiconductors B being stacked in each of the superlattice layers, a relationship Eg (A)>Eg (B) holds, where Eg (A) denotes a band gap of the group III nitride semiconductor A, and Eg (B) denotes a band gap of the group III nitride semiconductor B, the group III nitride semiconductor A is a film containing AlInN, and the film contains oxygen (O) at a concentration of at least $1\times10^{18}$ cm$^{-3}$, the group III nitride semiconductor A has a film thickness of at most 5 nm, and a current is injected in a stacking direction of the superlattice layers.

This can (i) effectively increase the vertical optical confinement factor Γv of the semiconductor light emitting element while the electrical resistance of the AlInN doped with (O) is equivalent to that of the conventional AlGaN material and (ii) decrease a lasing threshold current. Thus, the emission efficiency of the semiconductor light emitting element can be improved.

Moreover, the group III nitride semiconductor B may contain n-type GaN or n-type InGaN.

Thus, the donor level of the group III nitride semiconductor B and the level of oxygen (O) used for doping AlInN become closer. This can effectively lower electrical resistance.

Moreover, the group III nitride semiconductor B may contain oxygen (O) or silicon (Si).

This can effectively form a donor level in the group III nitride semiconductor B and lower electric resistance.

Moreover, the n-type layer, the active layer, and the p-type layer may be stacked on a substrate in stated order.

Moreover, the p-type layer, the active layer, and the n-type layer may be stacked on a substrate in stated order.

Moreover, the substrate may be a GaN substrate or a GaN template substrate.

The above structure allows a current to be injected to traverse the superlattice including the group III nitride semiconductors A and B, in the stacking direction.

Moreover, the period of the supperlattice layer may be shorter than 10 nm.

This can lower the resistance of the semiconductor superlattice layer.

Moreover, the period of the supperlattice layer may be shorter than 5 nm.

This can further lower the resistance of the semiconductor superlattice layer.

Moreover, the n-type layer may include an n-type distribution Bragg reflector in which first refractive nitride semiconductor films and a plurality of the semiconductor superlattice layers are alternately stacked, and the n-type distribution Bragg reflector may satisfy: $n1>n2$ and $n1\times d1=n2\times d2=1;4\times\lambda$, where $n1$ denotes a refractive index of each of the first refractive index nitride semiconductor films, $d1$ denotes a film thickness of each of the first refractive index nitride semiconductor films, $n2$ denotes a refractive index of the semiconductor superlattice layer, $d2$ denotes a total film thickness of the semiconductor superlattice layer in which the group III nitride semiconductors A and the group III nitride semiconductors B are alternately stacked, and $\lambda$ denotes an emission wavelength of the active layer.

This can form an n-type distribution Bragg reflector (DBR) having high electroconductivity and optical reflectivity.

The following describes embodiments in detail with reference to the drawings. It should be noted that identical reference sings have been used to designate identical elements that are common to the figures, and repeated explanation is omitted. The following embodiments are mere examples in which the present invention is embodied. Thus, for example, the arrangement of structural components in the present invention is not limited to the following examples. Various modifications can be made to the present invention within the scope of the claims.

Embodiment 1

The following describes a semiconductor light emitting element 100 according to Embodiment 1. In the present embodiment, a green semiconductor laser (a wavelength of 520 nm) using a hexagonal group III nitride semiconductor is used as an embodiment of the semiconductor light emitting element 100. The following describes the semiconductor light emitting element 100 with reference to the drawings.

Figure 1B:
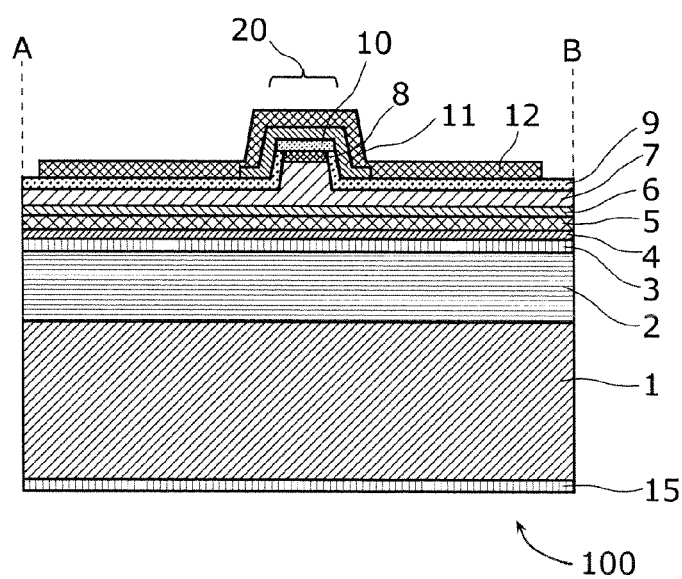
FIG. 1B is a cross-sectional view of the semiconductor light emitting element taken along the line A-B of FIG. 1A.

FIG. 1A is a top view of the semiconductor light emitting element 100 according to the present embodiment. FIG. 1B is a cross-sectional view of the semiconductor light emitting element 100 taken along the line A-B of FIG. 1A to include a light guide 20.

The following describes the structure of the semiconductor light emitting element 100.

The semiconductor light emitting element 100 illustrated in FIGS. 1A and 1B according to the present disclosure includes an n-type layer 3 containing a group III nitride semiconductor, an active layer 4, and a p-type layer 5. The n-type layer 3 includes a semiconductor superlattice layer which is a stack of superlattice layers and has a structure in which group III nitride semiconductors A and group III nitride semiconductors B are alternately stacked. Each of the superlattice layers includes a stack of one of the group III nitride semiconductors A and one of the group III nitride semiconductors B. The relationship Eg (A)>Eg (B) holds, where Eg (A) denotes a band gap of a group III nitride semiconductor A, and Eg (B) denotes a band gap of a group III nitride semiconductor B. The group III nitride semiconductor A is a film containing AlInN, and the film contains oxygen (O) at a concentration of at least $1\times10^{18}$ cm$^{-3}$. A current is injected in a stacking direction of the superlattice layers.

According to this structure, in the n-type layer 3, electrons injected into the conduction band of the group III nitride semiconductor B can pass a potential barrier due to AlInN by hopping conduction via a donor level caused by oxygen atoms contained in the film. This can dramatically lower resistance due to the barrier. Moreover, AlInN has a lower refractive index than AlGaN which has been used as a conventional n-type layer. This allows the n-type layer 3 to function not only as an electron injection layer but also as a strong light confinement layer.

Thus, the emission efficiency of the semiconductor light emitting element can be improved by effectively increasing the vertical optical confinement factor ry of the semiconductor light emitting element and lowering a lasing threshold current.

The following describes more specific examples which also include nonessential optional elements.

In the semiconductor light emitting element 100, a semiconductor stacked structure is formed on a semiconductor substrate 1 which is an n-type hexagonal GaN substrate and has a main surface (0001). In the semiconductor stacked structure, n-type layers containing group III nitride semiconductors, an active layer, and p-type layers are stacked in this order. Specifically, a semiconductor superlattice layer 2 which is, for instance, an AlInN(O)/n-GaN superlattice clad layer and an n-type light guide layer 3 which is, for example, n-GaN are stacked as the n-type layers. An active layer 4 which is, for example, an InGaN/GaN multiple quantum well is formed as the active layer. A p-type light guide layer 5 which is, for example, p-GaN, an electron barrier layer 6 which is, for example, p-$Al_{0.20}$GaN, a p-type clad layer 7 which is, for example, p-$Al_{0.15}$GaN/GaN superlattice, and a p-type contact layer 8 which is, for example, p-GaN are stacked as the p-type layers.

The both sides of the light guide 20 of the semiconductor light emitting element 100 are insulated by an insulating film 9 which is, for example, $SiO_2$. A p-electrode 10 and an n-electrode 15 are formed to vertically sandwich the semiconductor stacked structure. Such a structure allows a current (electron) to be injected into the semiconductor superlattice layer 2 of the semiconductor stacked structure in the vertical direction (stacking direction of the layers). That is, a current path passing through the semiconductor superlattice layer 2 in the vertical direction (stacking direction) is formed between the p-electrode 10 and the n-electrode 15.

The p-electrode 10 which contains, for example, Pd and Pt, a wiring electrode 11 which contains, for example, Ti, Pt, and Au, and a pad electrode 12 which contains, for example, Ti and Au are formed by a desired pattern at the top portion of the light guide. The n-electrode 15 which contains, for example, Cu and Au is formed on the opposite side of the semiconductor substrate 1.

A front coating 13 and a rear coating 14 for reflecting light in the light guide 20 are formed to sandwich the light guide 20 of the semiconductor light emitting element 100. That is, the front coating 13 and the rear coating 14 are formed at the end faces of the semiconductor light emitting element 100 which are illustrated at the top and bottom of FIG. 1A in the paper. Here, each of the front coating 13 and the rear coating 14 includes, for example, a dielectric multilayer.

It should be noted that the n-type layers, the active layer, and the p-type layers are stacked on the semiconductor substrate in the stated order in the present embodiment. However, the stacking order of the n-type layers and the p-type layers may be changed. That is, the p-type layers, the active layer, and the n-type layers may be stacked on the semiconductor substrate in the stated order.

The following describes the detailed structure of the semiconductor light emitting element 100 together with a method of manufacturing the semiconductor light emitting element 100.

The semiconductor superlattice layer 2 to the p-type contact layer 8 are continuously formed above the semiconductor substrate 1 using, for example, a metal organic chemical vapor deposition (MOCVD) method. Here, the semiconductor substrate 1 is the n-type hexagonal GaN and has the surface (0001) as the main surface.

The semiconductor superlattice layer 2 is a stack of 70-period superlattice layers, each including a stack of 2.5-nm n-type GaN and 2.5-nm AlIn$_{0.177}$N (a total film thickness of 350 nm).

Here, as gas raw materials for forming films, for example, trimethylgallium (TEG), trimethylindium (TMI), and trimethylaluminum (TMA) may be used as group III raw materials, silane may be used as an n-type impurity, and ammonia may be used as a group V raw material. The n-GaN layer may have a Si concentration of around $1 \times 10^{19}$ cm$^{-3}$. Preferably, the AlInN layer should be doped with oxygen at an O concentration of around $1 \times 10^{18}$ cm$^{-3}$ or higher. Moreover, the n-type GaN layer may contain oxygen. As a way to dope the AlInN layer with oxygen, there is a way to add trace oxygen to source gas.

As another way of simple oxygen doping, when an organic Al raw material such as TMA is used, oxygen can be added as an impurity from the organic Al raw material by setting a growth temperature at which an AlInN film is formed to a lower temperature than a temperature range (approximately 800° C. to 1200° C.) generally and widely used for the growth of a nitride semiconductor. Here, the lower temperature is, for example, around 700° C. to 850° C., more preferably, around 700° C. to 800° C.

The n-GaN (a Si concentration of $5 \times 10^{17}$ cm$^{-3}$) is grown by 100 nm as the n-type light guide layer 3. As the active layer 4, a quantum well active layer is grown which includes 3 periods, each including an In$_{0.02}$GaN barrier layer and an In$_{0.23}$GaN quantum well layer. Here, the InGaN barrier layer may have a film thickness of 7.5 nm. The quantum well layer may have a film thickness of 3 nm. p-GaN is formed at a thickness of 100 nm as the p-type light guide layer 5. The p-GaN layer may be formed using, for example, Cp$_2$Mg to have a Mg concentration of $5 \times 10^{19}$ cm$^{-3}$. Furthermore, p-Al$_{0.20}$GaN (a Mg concentration of $5 \times 10^{19}$ cm$^{-3}$) is formed at a thickness of 10 nm as the electron barrier layer 6. As the p-type clad layer 7, a stack of 150 periods, each including 1.5-nm p-AlGaN (a Mg concentration of $5 \times 10^{19}$ cm$^{-3}$) and a 1.5-nm p-GaN (a Mg concentration of $5 \times 10^{19}$ cm$^{-3}$) layer is formed at a thickness of 450 nm. p-GaN (a Mg concentration of $3 \times 10^{20}$ cm$^{-3}$) is formed at a thickness of 10 nm as the p-type contact layer 8.

It should be noted that in addition to the MOCVD method, molecular beam epitaxy (MBE), chemical beam epitaxy (CBE), or other growth method which allows a GaN blue purple semiconductor laser structure to grow may be used for a crystal growth method used for forming the above semiconductor stacked structure.

The grown wafer is processed into a ridge stripe laser.

A SiO$_2$ insulating film (not illustrated in the figure) containing SiO$_2$ and having a film thickness of 0.3 μm is formed on the p-type contact layer 8 by, for example, a thermal CVD method. The SiO$_2$ insulating film is etched into 8-μm-width stripes, by a photolithography method and hydrofluoric acid etching. Here, the orientation of the stripes is parallel to the m-axis direction of hexagonal GaN in view of that the end faces of the laser are formed using a natural cleavage plane (m plane) of a hexagonal nitride semiconductor.

A ridge stripe part of the light guide 20 is formed from above the p-type contact layer 8 and the p-type clad layer 7, by etching the top portion of the stacked structure by 0.35 μm using an inductive coupled plasma (ICP) etching method and the SiO$_2$ insulating film. A second mask film is removed using hydrofluoric acid, and the insulating film 9 having a film thickness of 200 nm and containing SiO$_2$ is formed by the thermal CVD method on the exposed p-type clad layer 7 to cover the entire surface including the ridge stripe part. Thus, the SiO$_2$ insulating film is formed again.

A resist pattern (not illustrated in the figure) having 7.5-μm-width openings to be along the ridge stripe part is formed by a lithography method on the top surface of the ridge stripe part (the light guide 20) in the insulating film 9. The SiO$_2$ insulating film 9 is etched using the resist pattern as a mask and using reactive ion etching (RIE) with, for example, Trifluoromethane (CHF$_3$) gas. As a result, the p-type contact layer 8 is exposed from the top surface of the ridge stripe part.

A metal film stack forming the p-electrode 10 containing, for example, 40-nm palladium (Pd) and 35-nm platinum (Pt) is formed by, for example, electron beam (EB) deposition on at least the p-type contact layer 8 exposed from the top surface of the ridge stripe part. The metal film stack formed on regions other than the ridge stripe part is removed by a lift-off method for removing the resist pattern to form the p-electrode 10.

As FIG. 1B illustrates, the wiring electrode 11 is selectively formed by the lithography method and lift-off method on the insulating film 9 to cover the p-electrode 10 on the ridge stripe part. Here, the wiring electrode 11 contains, for example, Ti, Pt, and Au, and has, for example, a planar size of 750 μm in a direction parallel to the ridge stripe part and a planar size of 150 μm in a direction perpendicular to the ridge stripe part. Here, the wiring electrode 11 is a metal film stack of 50-nm titanium (Ti), 200-nm platinum (Pt), and 100-nm gold (Au).

It should be noted that laser devices are generally formed on the main surface of a wafer in a matrix. Thus, when the laser devices on the substrate before wafer division are separated as individual chips, the p-electrode 10 adhered to the wiring electrode 11 may be stripped from the p-type contact layer 8. Thus, as FIG. 1A illustrates, preferably, the wiring electrodes 11 of adjacent chips should not be connected.

For example, an Au layer having a thickness of 10 μm is formed on the wiring electrode 11 by an electroplating method to form the pad electrode 12. This can mount a laser chip by wire bonding and effectively dissipate heat generated in the active layer 4. Thus, the reliability of the semiconductor light emitting element 100 can be improved.

The bottom surface of the semiconductor light emitting element 100 before wafer division including the layers with the Au pad electrode at the top is polished with diamond slurry to decrease the film thickness of the semiconductor substrate 1 to around 100 μm. For example, a metal film stack of 5-nm Ti, 10-nm Pt, and 1000-nm Au is formed on the bottom surface of the semiconductor substrate 1 (the side opposite to the side where the light guide 20 is formed), by, for example, the EB deposition, to form the n-electrode 15.

The semiconductor light emitting elements 100 before the wafer division are cleaved along m planes so that each has a length in the m-axis direction of, for example, 800 μm (first cleavage). The front coating 13 is formed on the cleavage plane from which a laser beam is emitted and the rear coating 14 formed on the opposite cleavage plane, using, for example, electron cyclotron resonance (ECR) sputtering. Here, for example, a dielectric film such as SiO$_2$ single layer film is used as the material of the front coating 13. Moreover, for example, a dielectric film such as a ZrO$_2$/SiO$_2$ film stack of is used as the material of the rear coating 14. It should be noted that the highly-efficient semiconductor light emitting element 100 can be achieved by setting the refractive index of the front side (the side from which light is emitted) of the semiconductor light emitting element 100 to, for example, 15% and setting the refractive index of the rear side (the opposite side of the side from which light is emitted) to, for example, 90%.

The semiconductor light emitting elements 100 cleaved in the first cleavage are cleaved along a planes, between the light guides 20 so that each has a length in an a-axis direction of 200 μm (second cleavage).

Figure 2:
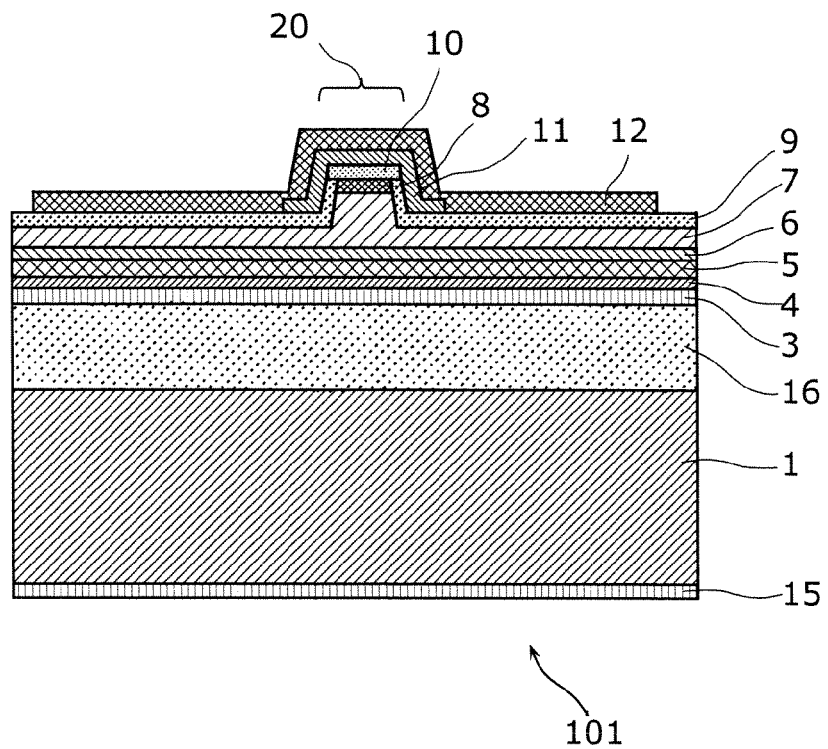
FIG. 2 illustrates a structure of a semiconductor light emitting element according to comparison example 1.
Figure 3:
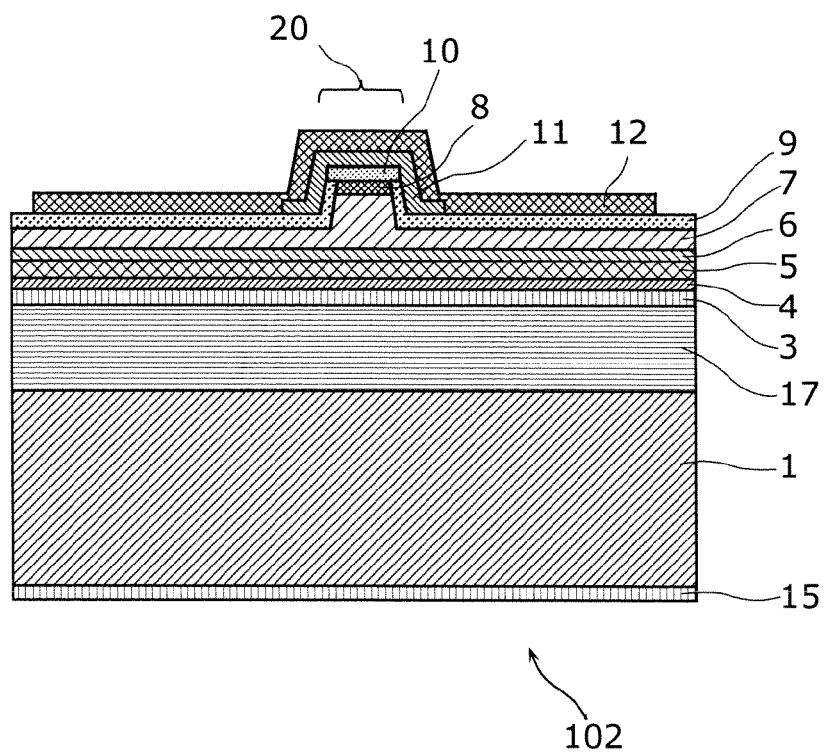
FIG. 3 illustrates a structure of a semiconductor light emitting element according to comparison example 2.
Figure 4:
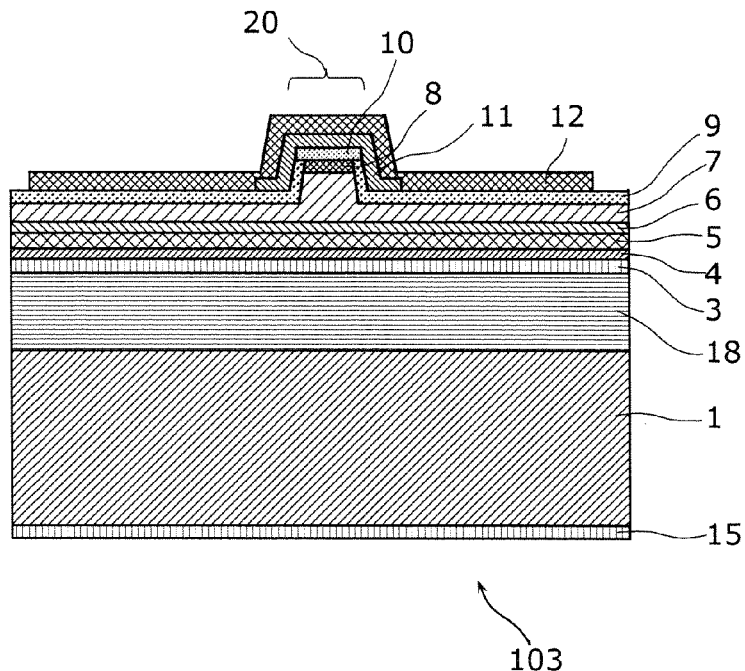
FIG. 4 illustrates a structure of a semiconductor light emitting element according to comparison example 3.

To study effects of the semiconductor light emitting element 100 in the present embodiment, the following describes semiconductor light emitting elements 101, 102, and 103 according to comparison examples 1 to 3 illustrated in FIGS. 2 to 4.

FIG. 2 schematically illustrates a structure of the semiconductor light emitting element 101 according to comparison example 1. As FIG. 2 illustrates, in the semiconductor light emitting element 101, the semiconductor superlattice layer 2 in the semiconductor light emitting element 100 illustrated in FIGS. 1A and 1B is replaced with a first clad layer 16 which is an AlInN single layer film.

FIG. 3 schematically illustrates a structure of the semiconductor light emitting element 102 according to comparison example 2. As FIG. 3 illustrates, in the semiconductor light emitting element 102, the semiconductor superlattice layer 2 in the semiconductor light emitting element 100 illustrated in FIGS. 1A and 1B is replaced with a first clad layer 17 which is an n-AlGaN/n-GaN superlattice.

FIG. 4 schematically illustrates a structure of the semiconductor light emitting element 103 according to comparison example 3. As FIG. 4 illustrates, in the semiconductor light emitting element 103, the semiconductor superlattice layer 2 in the semiconductor light emitting element 100 illustrated in FIGS. 1A and 1B is replaced with a first clad layer 18 which is an AlInN (not doped with O)/n-GaN superlattice.

To describe the advantageous effects of the semiconductor light emitting element 100 according to the present embodiment, the following describes results obtained by studying both theories and test results. Band energy of the conduction band (Ec), which is related to electron conduction, in a semiconductor band structure near an n-type clad layer in each of the laser structures illustrated in FIGS. 1A to 4 was calculated by self-consistently solving the Schrodinger equation and Poisson equation.

Figure 5:
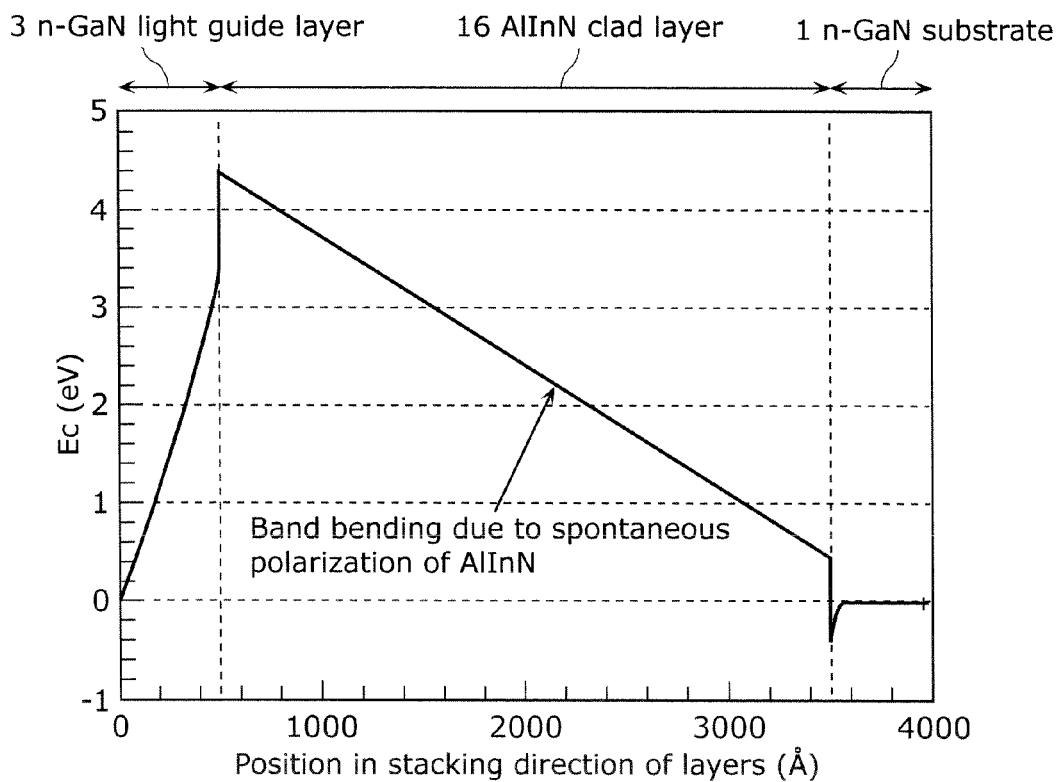
FIG. 5 is a figure for explaining a calculation result of Ec of the band structure of a conduction band near a first clad layer in comparison example 1.

Here, as to physical parameters necessary for calculations, i.e., polarization due to lattice distortion of AlGaN for GaN, the magnitudes of spontaneous polarization of AlGaN and AlInN, band offset, the effective mass of an electron, and others, the values written in the documents: J. Kuzmik, IEEE Electron Device Lett. 22, 510 (2001) and M. Gonschorek, J.-F. Carlin, E. Feltin, M. A. Py, and N. Grandjean, Appl. Phys. Lett. 89, 062106 (2006) were used. FIGS. 5 to 7 illustrate the results of the calculations.

FIG. 5 illustrates the result of calculating Ec (eV) near the first clad layer 16 (AlInN single layer film) of the semiconductor light emitting element 101 illustrated in FIG. 2. AlInN has a strong electric filed near the first clad layer 16 due to spontaneous polarization. Thus, it is clear from the figure that the band of potential energy of the Ec sharply bends from the n-type GaN semiconductor substrate 1 toward the top surface of the stacked structure.

For instance, when the stacked structure has a thickness of 350 nm, the maximum amount of band bending from the semiconductor substrate 1 exceeds 4 eV. To inject a current into the active layer 4 from the semiconductor substrate 1 in the semiconductor light emitting element 101 by electrons overcoming the potential barrier of AlInN which is the first clad layer 16, a voltage drop of at least 4 V is caused at least only in the n-clad layer. This leads to a significant increase in power consumption.

In view of this, the inventors et al. also considered the approach of lowering resistance by doping AlInN with Si to form n-type AlInN. A donor level which Si forms in the band of AlInN is deep at around −1.5 eV from the edge of the conduction band (Ec). Thus, the inventors found that the approach hardly contributes to electron conduction and advantageous effects cannot be obtained.

Figure 6A:
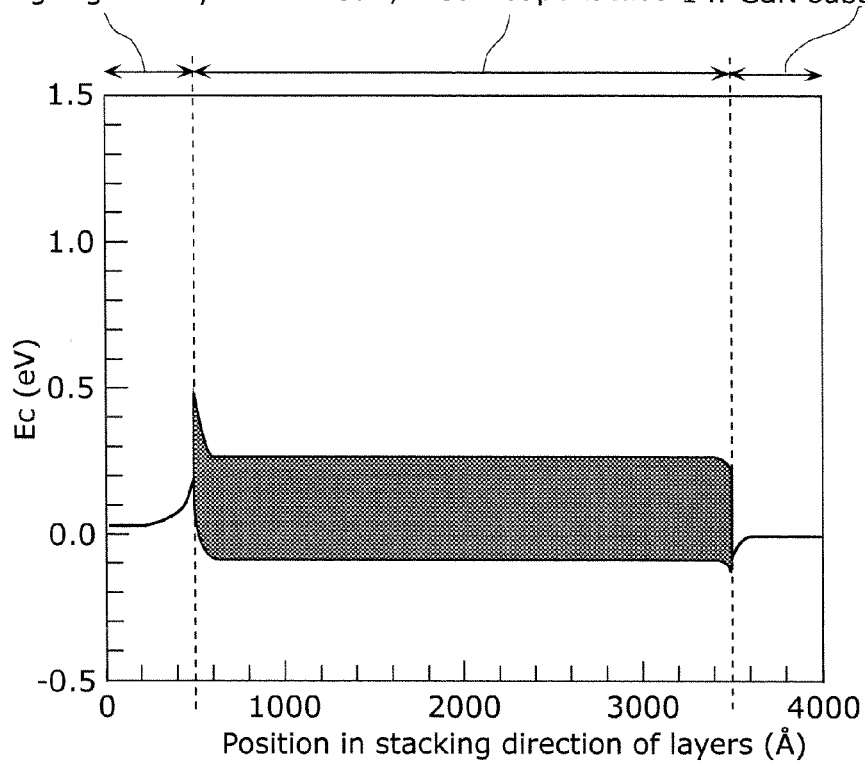
FIG. 6A is a figure for explaining a calculation result of Ec of the band structure of a conduction band near a first clad layer in comparison example 2.
Figure 6B:
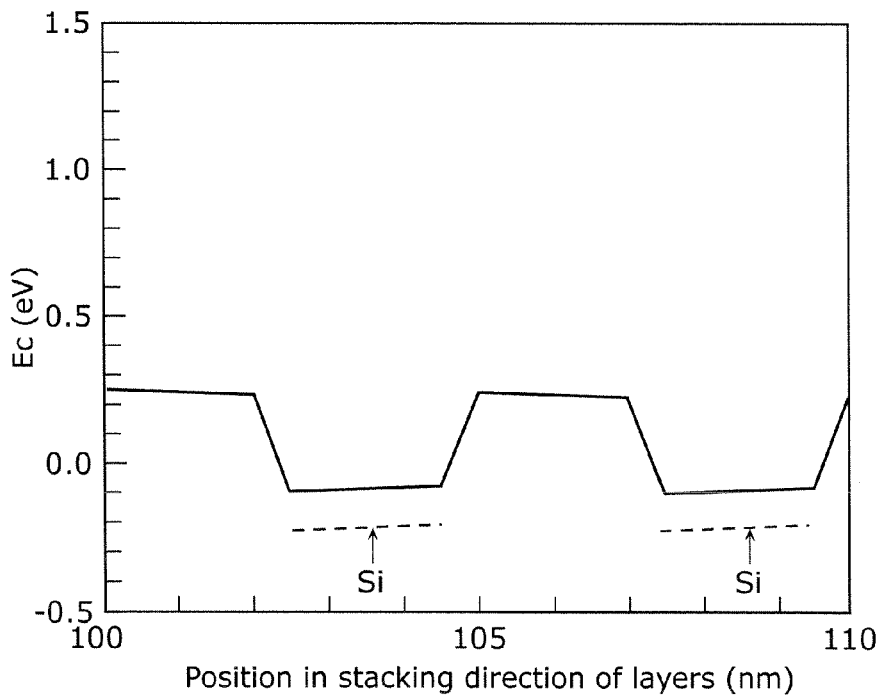
FIG. 6B is a figure for explaining a calculation result of Ec of the band structure of the conduction band near the first clad layer in comparison example 2.

Subsequently, FIGS. 6A and 6B illustrate results of calculating Ec (eV) near the first clad layer 17 (AlGaN/n-GaN superlattice) of the semiconductor light emitting element 102 illustrated in FIG. 3. In AlGaN/n-GaN superlattice, AlGaN has band bending of around 0.45 eV for n-GaN due to the features of polarization and wide band gap of AlGaN. However, as written in NPL 2, an electron localized in n-GaN transmits through the AlGaN barrier and the electron couple with more than one n-GaN. Thus, the electrons is hardly affected by the potential barrier (in current-voltage characteristics, a Schottky barrier is not present, but only ohmic resistance is present).

In view of this, an approach to combine comparison examples 1 and 2 to avoid a voltage increase due to the AlInN layer by forming a superlattice of AlInN and n-GaN and through quantum-coupling of electrons between n-GaN and n-GaN as with comparison 2 can be also considered. Such a structure is comparison example 3.

Figure 7A:
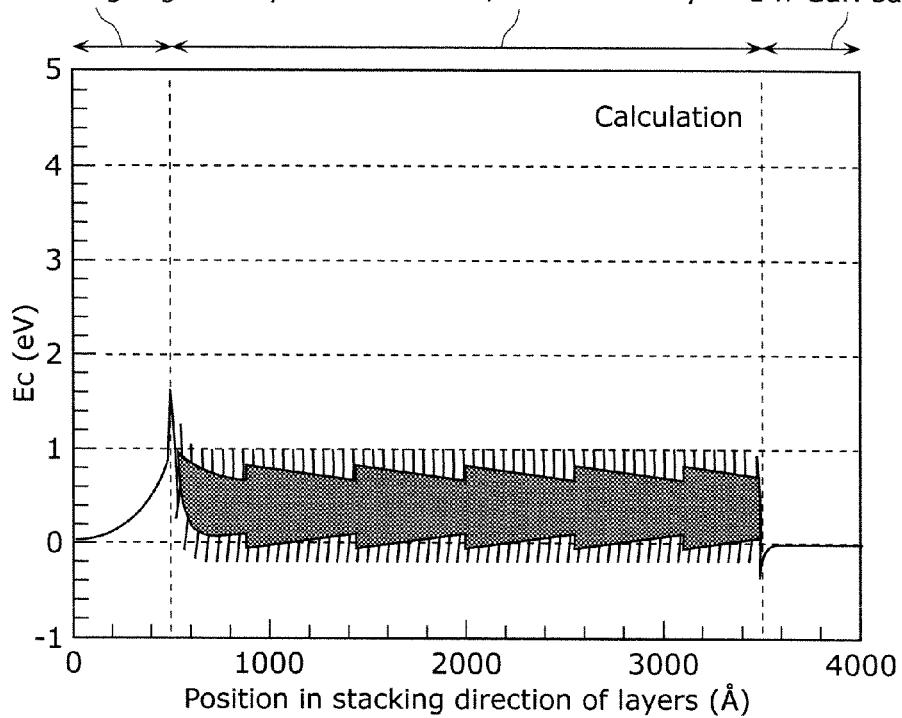
FIG. 7A is a figure for explaining a calculation result of Ec of the band structure of a conduction band near a first clad layer in comparison example 3.

FIG. 7A is a result of calculation when the superlattice of AlInN and n-GaN is formed (the semiconductor light emitting element 103 in FIG. 4 illustrates the structure). Because of the presence of n-GaN, the band bending of AlInN decreases to 1 eV in the superlattice. Moreover, since n-GaN functions as a quantum well, an electron transmits through adjacent AlInN and couples with the adjacent n-GaN layer in the quantum coupling. Thus, an actual potential barrier for electrons is expected to be lowered.

Figure 7B:
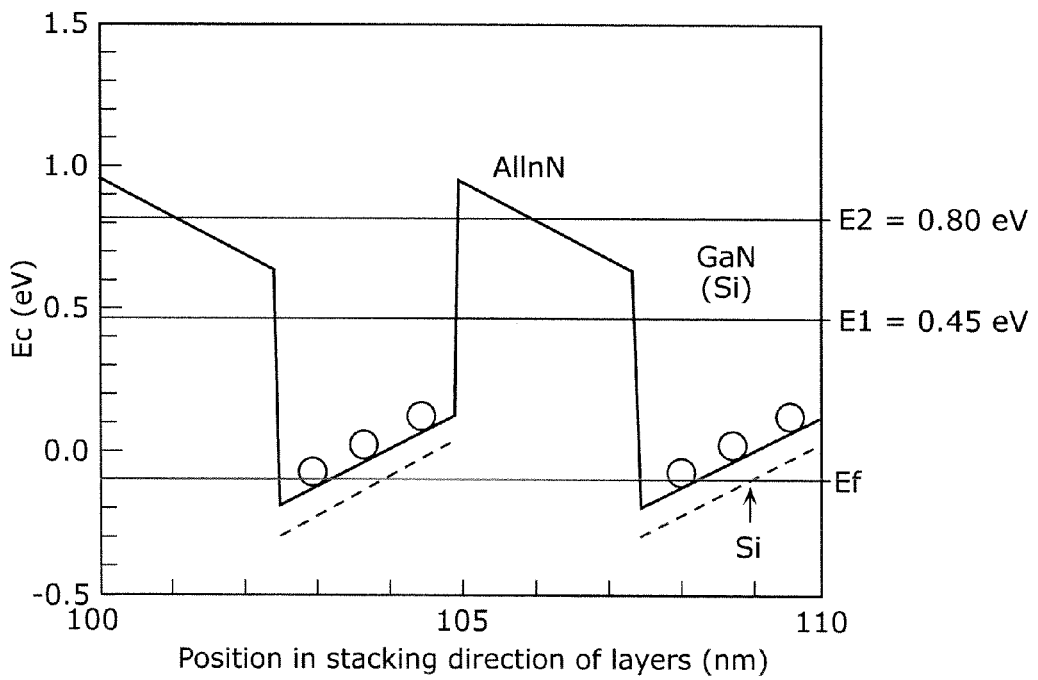
FIG. 7B is a figure for explaining a calculation result of Ec of the band structure of the conduction band near the first clad layer in comparison example 3.

However, a major problem has been found also in this case. FIG. 7B is a partial enlargement of FIG. 7A. FIG. 7B illustrates the result of calculating quantized energy in the n-GaN quantum well. E1 represents a ground level, and E2 represents a second level.

E1=0.45 eV. Thus, in fact, electrons having E1 (energy) rather than the band edge energy of n-GaN are localized. That is, to inject a current (electron) into the AlInN/n-GaN superlattice, a voltage of at least 0.45 V is applied, i.e., a voltage decrease occurs in the superlattice.

Figure 8:
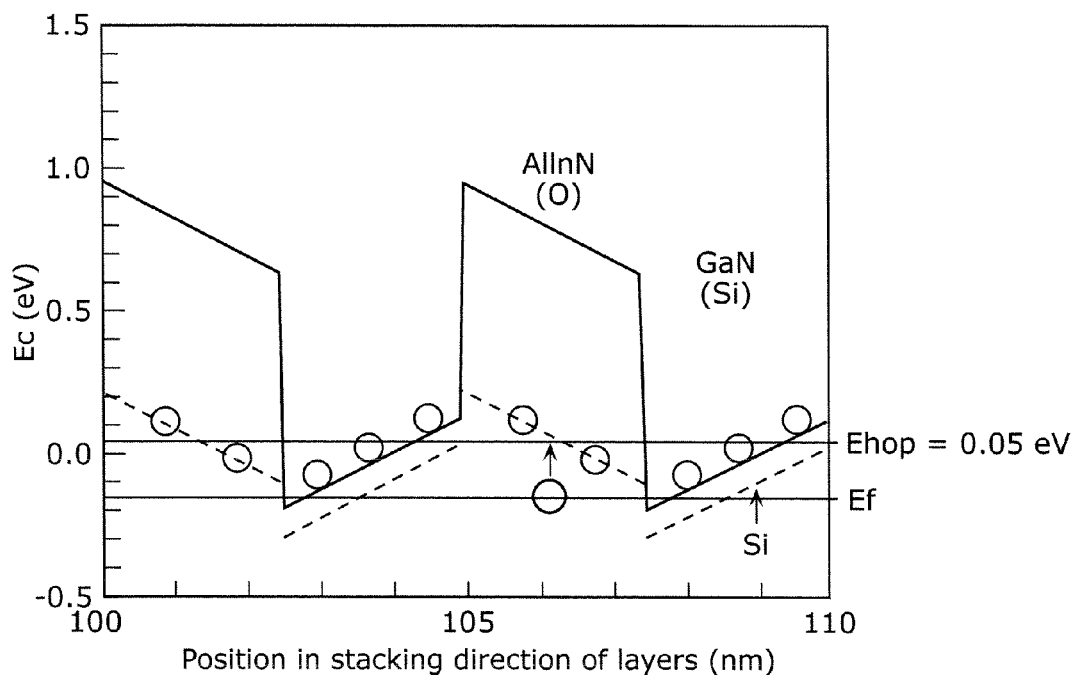
FIG. 8 is a figure for explaining a calculation result of Ec the band structure of a conduction band in a portion of AlInN (O)/n-GaN superlattice in Embodiment 1.

FIG. 8 illustrates a band structure in the present embodiment obtained by doping AlInN with oxygen (O) in the structure illustrated in FIGS. 7A and 7B. The material composition is similar to that of AlInN/n-GaN supterlattice in FIGS. 7A and 7B. Thus, the calculation results are basically the same. Thus, a figure corresponding to FIG. 7A is omitted.

The inventors of the present invention et al. have found from the result illustrated in FIG. 8 that oxygen (O) with which AlInN has been doped forms a donor level at a potential of about 1 eV from the band edge of the conduction band of AlInN. A level at such a deep potential hardly affects the electrical conduction of AlInN itself (the concentration of electrons does not increase). However, this level is substantially the same as potential energy of the conduction band of n-GaN. Thus, the inventors of the present invention et al. presumed that hopping conduction of electrons localized in n-GaN is possible via the level of oxygen (O) (hopping effects). In this case, the hopping level (written as Ehop in FIG. 8) is at a potential of 0.05 eV from the band edge of n-GaN, and is substantially the same energy level at the band edge of n-GaN. Thus, the hopping level is substantially expected to be ohmic resistance.

Figure 9A:
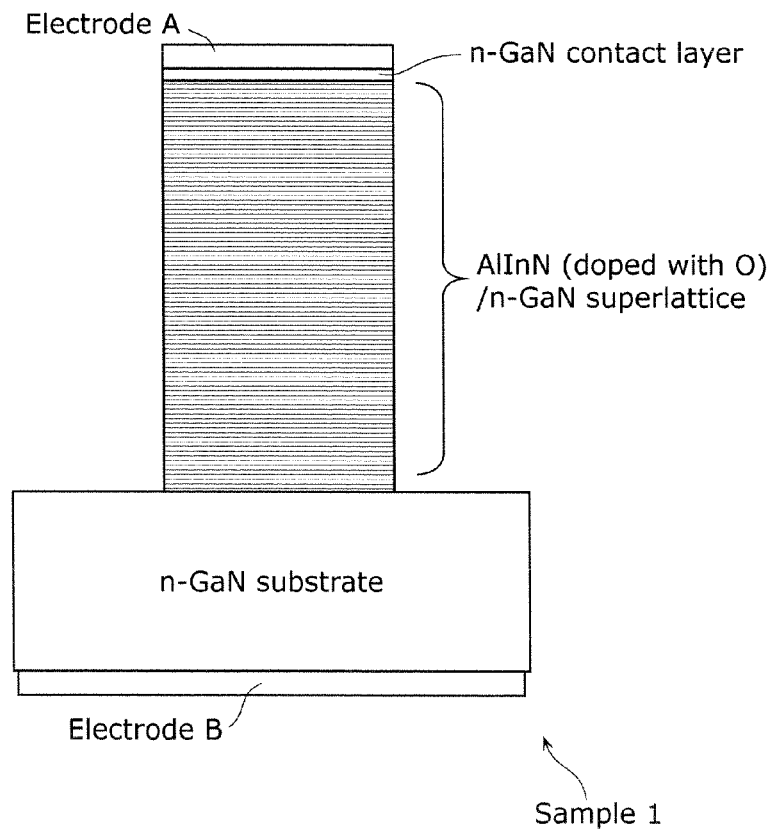
FIG. 9A is a figure for explaining a sample 1 used for studying effects of a superlattice structure according to Embodiment 1.
Figure 9B:
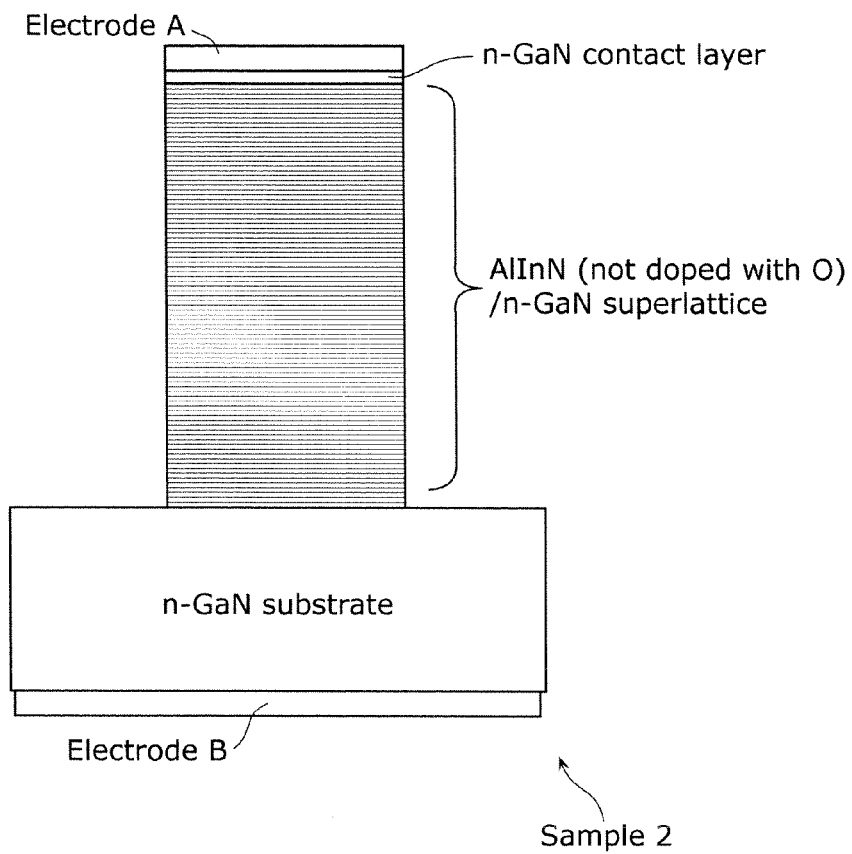
FIG. 9B is a figure for explaining a sample 2 used for studying effects of the superlattice structure according to Embodiment 1.
Figure 9C:
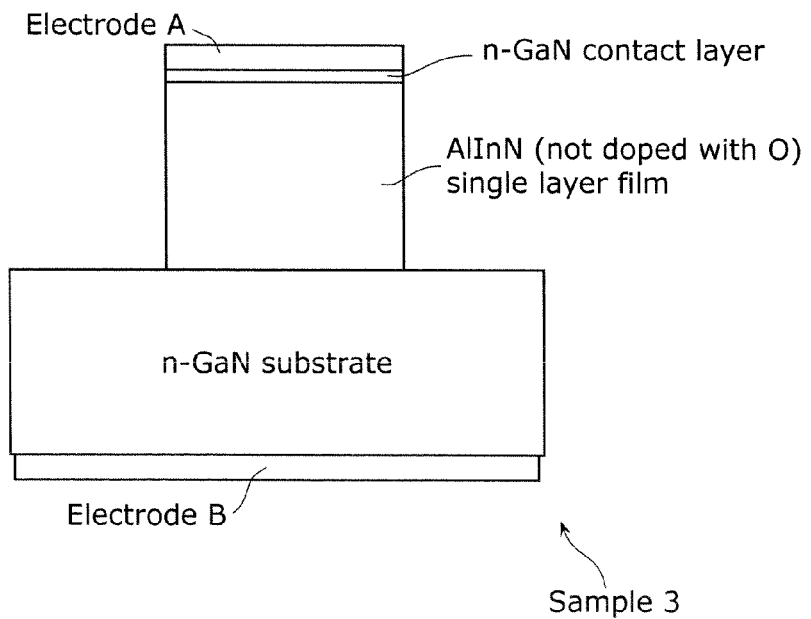
FIG. 9C is a figure for explaining a sample 3 used for studying effects of the superlattice structure according to Embodiment 1.

To study the above effects, the inventors et al. prepared three kinds of samples 1 to 3 illustrated in FIGS. 9A to 9C by performing the MOCVD method, photolithography, and ICP etching, and forming electrodes, and evaluated voltage-current characteristics between the electrodes A and B in the figures.

In the samples 1 to 3, an n-GaN substrate, an n-GaN contact layer, and an n-type clad layer corresponding to the semiconductor superlattice described in one of the present embodiment and the comparison examples are formed between the electrodes A and B both of which contain Ti, Pt, and Au. The size of the electrode A is 750×200 μm. The electrode B is formed on the entire bottom surface of the n-GaN substrate. The n-GaN contact layer has a Si concentration of $3 \times 10^{18}$ cm$^{-3}$ and a film thickness of 10 nm.

To eliminate effects caused by layers other than the n-type clad layer such as a voltage decrease due to pn junction, a laser structure as illustrated in FIGS. 1A and 1B is not employed. In sample 1 in FIG. 9A, AlInN (doped with O dope)/n-GaN superlattice (see FIG. 8 for the band structure) corresponding to the semiconductor superlattice layer 2 in the present embodiment is provided between the electrodes. In sample 2 in FIG. 9B, AlInN (not doped with O)/n-GaN superlattice (see FIG. 7A for the band structure) corresponding to the semiconductor superlattice layer 2 in the present embodiment is provided between the electrodes. In sample 3, AlInN single layer film (see FIG. 5 for the band structure) corresponding to the semiconductor superlattice layer 2 in the present embodiment is provided between the electrodes.

Figure 10:
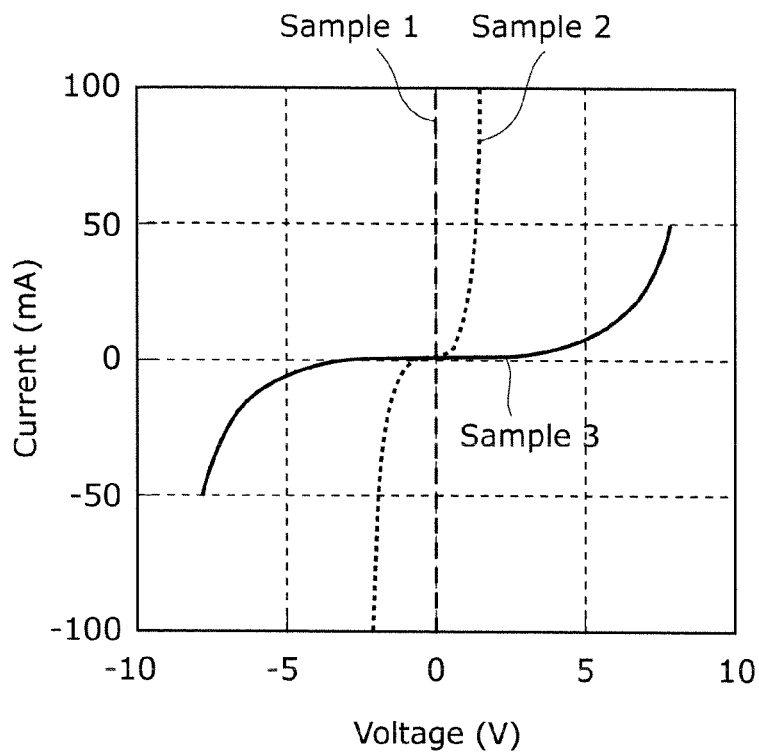
FIG. 10 is a figure for explaining current-voltage characteristics between the electrodes A and B in the structures illustrated in FIGS. 9A to 9C.

FIG. 10 illustrates the voltage-current characteristics of each of sample 1 to 3. A Schottky barrier of around 5 V exists in the AlInN single layer used in sample 3. A Schottky barrier of around 0.45 V exists in the AlInN (not doped with O)/n-GaN superlattice used in sample 2. Meanwhile, it is clear from the figure that AlInN(O)/n-GaN superlattice in sample 1 does not have a Schottky barrier, but has Ohmic features. Thus, the use of the semiconductor light emitting element 100 with a semiconductor superlattice layer as described in the present embodiment can decrease a lasing threshold and reduce power consumption without deteriorating an operating voltage.

It should be noted that the above hopping effect occurs only when the band gap (Eg) of the AlInN layer is greater than the Eg of the GaN layer. That is, the above effect occurs only when the AlInN layer and the GaN layer have the relationship Eg (AlInN)>Eg (GaN).

It should be noted that in the present embodiment, the semiconductor superlattice layer 2 is the AlInN(O)/n-GaN superlattice. However, the semiconductor superlattice layer 2 may be an AlInN(O)/n-InGaN superlattice. Also in this case, the AlInN layer and the InGaN layer need to have the relationship Eg (AlInN)>Eg (InGaN). That is, in the semiconductor superlattice layer 2, a semiconductor material to be combined with AlInN(O) needs to have a lower band gap (Eg) than AlInN.

Figure 11:
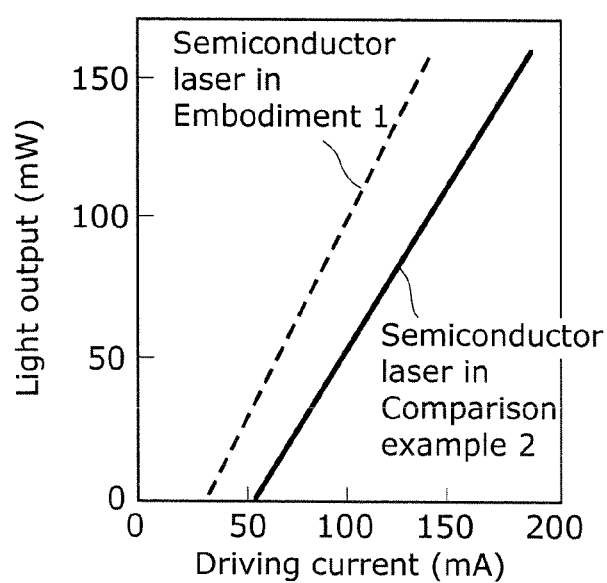
FIG. 11 is a figure for explaining current-light output characteristics of a semiconductor laser in Embodiment 1 and a semiconductor laser in comparison example 2.

FIG. 11 illustrates the current light output characteristics (experimental values) of the semiconductor light emitting element (semiconductor laser) 100 in the present embodiment having the structure in FIGS. 1A and 1B and the semiconductor light emitting element (semiconductor laser) 102 in comparison example 2 having the structure in FIG. 3. The current-voltage characteristics concurrently measured are substantially the same in the semiconductor light emitting element 100 and the light emitting element 102. Thus, explanation is omitted.

A vertical optical confinement factor ry improves and a threshold current decreases by employing the AlInN(O)/n-GaN superlattice layer as the n-type clad layer (the semiconductor superlattice layer 2). Moreover, a voltage increase due to the introduction of AlInN was not observed. Thus, the use of the semiconductor light emitting element 100 according to the present embodiment can achieve a semiconductor light emitting element having a high emission efficiency.

Figure 12:
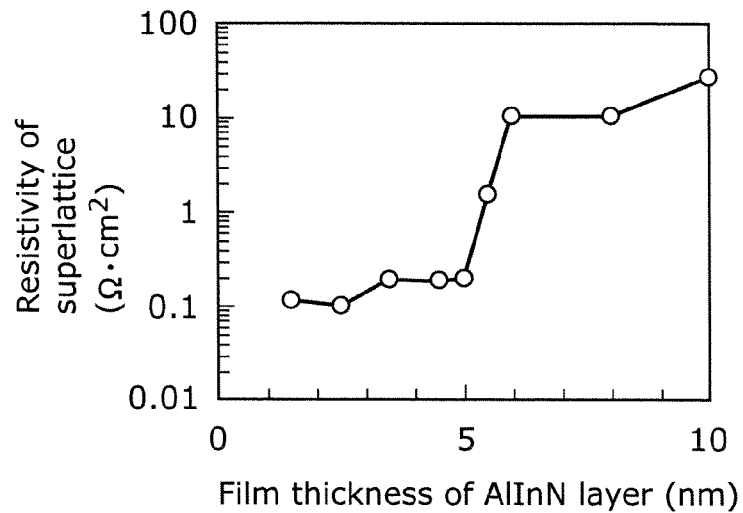
FIG. 12 is a figure for explaining the resistivity of the superlattice structure according to Embodiment 1 when the film thickness of an AlInN(O) layer is changed.
Figure 13:
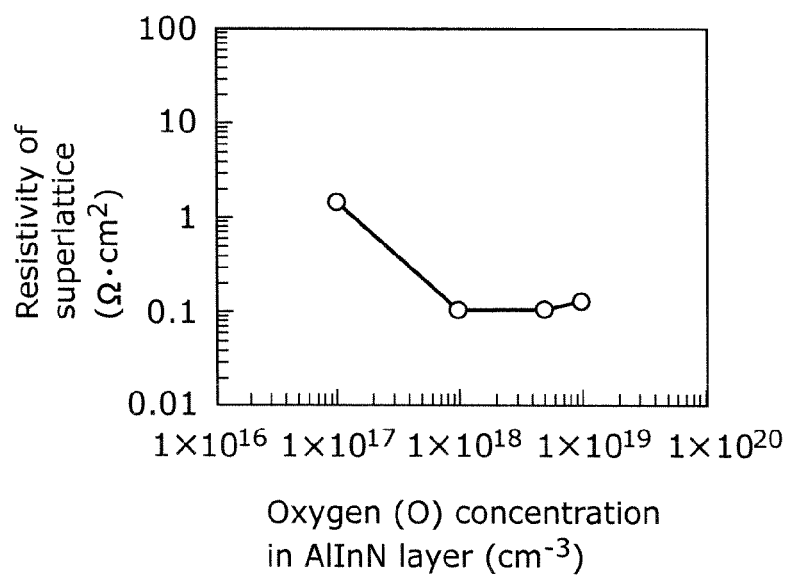
FIG. 13 is a figure for explaining the resistivity of the superlattice structure according to Embodiment 1 when the oxygen concentration of the AlInN(O) layer is changed.

Here, with reference to FIGS. 12 and 13, the following describes a preferred structure of the AlInN(O)/n-GaN superlattice layer described above. FIG. 12 illustrates a measurement result of a resistivity change of the superlattice structure (sample 1) when the film thickness of AlInN(O) of the AlInN(O)/n-GaN superlattice layer is changed. FIG. 13 illustrates a measurement result of a resistivity change of the superlattice structure (sample 1) when the oxygen (O) concentration of AlInN(O) of the AlInN(O)/n-GaN superlattice layer is changed.

It is clear from the result of FIG. 12 that the resistivity dramatically increases when the film thickness of AlInN(O) exceeds 5 nm. Thus, preferably, the film thickness of AlInN(O) should be at most 5 nm.

Moreover, it is clear from the result of FIG. 13 that the oxygen concentration of AlInN(O) falls below $1\times10^{18}$ cm$^{-3}$, the resistivity dramatically increases. Thus, preferably, the oxygen concentration of AlInN(O) should be at least $1\times10^{18}$ cm$^{-3}$.

It should be noted that preferably, a period of the AlInN(O)/n-GaN superlattice layer, i.e., the total thickness of an AlInN(O) film and an n-GaN film should be less than 10 nm, more preferably, less than 5 nm.

It should be noted that in the present embodiment, the AlInN(O)/n-GaN superlattice is used as the n-type clad layer. However, the combination of the AlInN(O)/n-GaN superlattice and the n-AlGaN layer may be the n-type clad layer.

It should be noted that in the present embodiment, the GaN-based substrate (e.g., GaN substrate and AlGaN substrate) belonging to the hexagonal system is used as the semiconductor substrate 1. However, other substrate which can grow a GaN-based material and contains, for example, silicon carbide (SIC), silicon (Si), sapphire (single crystal $Al_2O_3$), or zinc oxide (ZnO) can be used as the semiconductor substrate 1. Moreover, a template substrate made by growing GaN crystal on a substrate different from the GaN substrate, such as a sapphire substrate can be also used.

It should be noted that in the above description, a semiconductor laser having an emission wavelength in a green region is used as the semiconductor light emitting element in the present embodiment. A super luminescent diode may be used in which the emission spectral bandwidth is extended by decreasing the reflectance of the front side, a speckle noise is reduced, and the emission wavelength is in the green region. Furthermore, by decreasing the ratio of In to the composition of the active layer to around 16%, a blue semiconductor laser or a super luminescent diode having a blue wavelength of 445 nm may be used.

Embodiment 2

The following describes a semiconductor light emitting element 200 according to Embodiment 2. The following describes the semiconductor light emitting element 200 with reference to a drawing, using, as an example, a green surface emitting semiconductor laser (vertical-cavity surface-emitting laser (VCSEL)) which uses a hexagonal group III nitride semiconductor and has an emission wavelength of around 520 nm.

Figure 14:
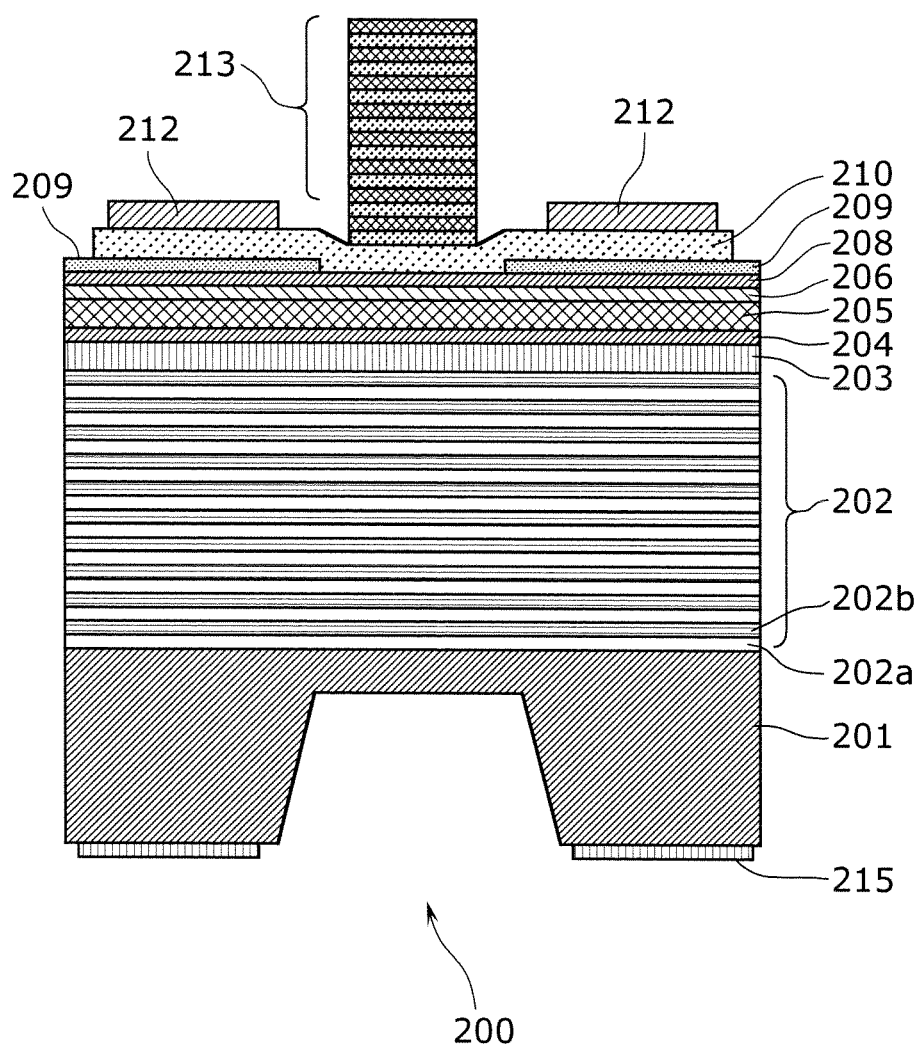
FIG. 14 illustrates a structure of a semiconductor light emitting element according to Embodiment 2.

FIG. 14 is a cross-sectional view of the semiconductor light emitting element 200 according to the present embodiment. The following describes the structure of the semiconductor light emitting element 200 and a method of manufacturing the semiconductor light emitting element 200 with reference to the drawing.

A first multilayer film 202 is formed by, for example, the MOCVD method on a semiconductor substrate 201 which is n-type hexagonal GaN and has a main surface (0001). The first multilayer film 202 has, for example, the stacked structure in which a first refractive index nitride semiconductor film 202a which is an n-GaN layer and a second refractive index nitride semiconductor film 202b which is an AlInN(O)/n-GaN superlattice structure are alternately formed.

Here, the film thickness of the first refractive index nitride semiconductor film 202a (n-GaN layer) is a value obtained by multiplying an oscillation wavelength $\lambda$ by ¼ and dividing the multiplied value by a refractive index at the oscillation wavelength of the semiconductor light emitting element 200. For instance, when the oscillation wavelength is 520 nm and the refractive index at an oscillation wavelength of 520 nm of the n-GaN layer is 2.4, the film thickness of the first refractive index nitride semiconductor film 202a (the n-GaN layer) is calculated as follows: 520×(¼)÷2.4=54.2 nm.

The second refractive index nitride semiconductor film 202b has a superlattice structure which is a stack of two or more periods, each including 2.5-nm $AlIn_{0.177}N$ (having an oxygen (O) concentration of $1\times10^{18}$ cm$^{-3}$) and 2.5-nm n-GaN. As with the case of the first refractive index nitride semiconductor film 202a, the total film thickness of the superlattice structure is a value obtained by multiplying the oscillation wavelength by a quarter and dividing the multiplied oscillation wavelength by the refractive index at the oscillation wavelength of the above superlattice structure. For instance, when the refractive index of the superlattice structure is 2.3, the film thickness of the second refractive index nitride semiconductor film 202b is calculated as follows: 520×(¼)÷2.3=56.5 nm.

Thus, the first multilayer film 202 is a stack of, for example, 30 periods, each including the 54.2-nm first refractive index nitride semiconductor film 202a and the 56.5-nm second refractive index nitride semiconductor film 202b.

The first multilayer film 202 functions as an n-type distribution Bragg reflector, and satisfies the relationships n1>n2 and n1×d1 =n2×d2=/1;4×λ, where n1 denotes the refractive index of the first refractive index nitride semiconductor film 202a, d1 denotes the film thickness of the first refractive index nitride semiconductor film 202a, n2 denotes the refractive index of the semiconductor superlattice layer included in the second refractive index nitride semiconductor film 202b, and d2 denotes the film thickness of the second refractive index nitride semiconductor film 202b.

Here, trimethylgallium (TEG), trimethylindium (TMI), and trimethylaluminum (TMA) may be used as group III raw materials, for example. Silane may be used as an n-type impurity, for example. Ammonia may be used as a group V raw material, for example. Here, as with Embodiment 1, preferably, the AlInN layer should be doped with oxygen at a concentration of around $1\times10^{18}$ cm$^{-3}$.

As a way to dope the AlInN layer with oxygen, there is a way to add trace oxygen to source gas. As another way of simple oxygen doping, when an organic Al raw material such as TMA is used, oxygen can be added as an impurity from the organic Al raw material by setting a growth temperature at which an AlInN film is formed to a lower temperature than a temperature range (approximately 800° C. to 1200° C.) generally and widely used for the growth of a nitride semiconductor. Here, the lower temperature is, for example, around 700° C. to 850° C., more preferably, around 700° C. to 800° C.

GaN is grown by 53 nm to as a first nitride semiconductor film 203. Furthermore, an active layer 204 is grown which is a stack of 3 periods, each including an $In_{0.02}GaN$ barrier layer and an $In_{0.23}GaN$ quantum well layer. Here, the InGaN barrier layer may have a film thickness of 7.5 nm. The quantum well layer may have a film thickness of 3 nm.

GaN is grown by 40 nm as a second nitride semiconductor film 205. Furthermore, 10-nm $p-Al_{0.20}GaN$ (having a Mg concentration of $5\times10^{19}$ cm$^{-3}$) is formed as an electron barrier layer 206. Subsequently, p-GaN (having a Mg concentration of $3\times10^{20}$ cm$^{-3}$) is formed at a thickness of, for example, 10 nm, as a p-type contact layer 208.

In addition to the MOCVD method, molecular beam epitaxy (MBE), chemical beam epitaxy (CBE), or other growth method may be used for a crystal growth method used for forming the above stacked structure.

Patterning or other process is performed on the grown nitride semiconductor layers so that a current can be injected.

By, for example, the thermal CVD method, an insulating film 209 which contains $SiO_2$ and has a film thickness of, for example, 0.3 μm is formed and patterned on the p-type contact layer 208 so that only a laser emitting portion is exposed.

A transparent electrode 210 (having a film thickness of 144 nm), which is, for example, indium thin oxide (ITO), is formed on the surface of the insulating film 209, and only the peripheral regions of the transparent electrode 210 are removed by patterning.

A second multilayer film 213 which is, for example, $TiO_2$ and $SiO_2$ multilayer film is formed on the transparent electrode 210, and portions of the second multilayer film 213 other than the portion of the second multilayer film 213 corresponding to the laser emitting part are removed by patterning.

P-electrodes 212 of, for example, Ti, Pt, and Au are patterned on the transparent electrode 210, at a periphery of the laser emitting portion.

The semiconductor substrate 201 of the semiconductor light emitting element 200 before wafer division is polished so that the semiconductor substrate 201 becomes thinner and has a predetermined thickness of, for example, 100 μm.

By patterning using the $SiO_2$ insulating film and wet etching using an alkaline solution (e.g., KOH), a circular light-emitting opening is formed in a region on the side where the bottom surface of the wafer is present, i.e., the side opposite to the side where the second multilayer film (dielectric insulating film) 213 is formed at the top surface of the wafer. N-type electrodes 215 of, for example, Ti, Pt, and Au are formed on the polished surface other than a light emitting region.

The following describes an operation of the semiconductor light emitting element 200. The semiconductor light emitting element 200 has the structure in which the two electrodes (the p-electrodes 212 and the n-electrodes 215) vertically sandwich a semiconductor stacked structure including an n-type layer having the AlInN(O)/n-GaN superlattice structure, an active layer, and p-type layer. Such a structure allows a current (electrons) to be injected into the AlInN(O)/n-GaN superlattice structure in the vertical direction (stacking direction). That is, a current path passing through the AlInN(O)/n-GaN superlattice structure in the vertical direction (stacking direction) is formed between the two electrodes.

The current injected from the p-electrodes 212 and the n-electrodes 215 transmits through the transparent electrode 210, and is focused on and around the laser emitting part by the insulating film 209, to be injected into the active layer 204. The electrons and holes injected into the active layer 204 are converted into light having a center wavelength of 520 nm. The light obtained through the conversion is amplified as induced emission light by the first multilayer film 202 and the second multilayer film 213 functioning as reflecting films, and emitted as a laser beam from the first multilayer film 202.

According to the above structure, the use of the semiconductor superlattice layer described in the present embodiment can easily form the structure of and manufacture a green surface emitting semiconductor laser having an emission wavelength of around 520 nm.

Also in the present embodiment as with Embodiment 1, preferably, the film thickness of AlInN(O) should be at most 5 nm. Moreover, preferably, the oxygen concentration of AlInN(O) should be at least $1\times10^{18}$ cm$^{-3}$. It should be noted that preferably, a period of the AlInN(O)/n-GaN superlattice layer, i.e., the total thickness of an AlInN(O) film and an n-GaN film should be less than 10 nm, more preferably, less than 5 nm.

Also in the present embodiment, the GaN-based substrate (e.g., GaN substrate and AlGaN substrate) belonging to the hexagonal system is used as the semiconductor substrate 201. However, other substrate which can grow a GaN-based material and contains, for example, silicon carbide (SiC), silicon (Si), sapphire (single crystal $Al_2O_3$), or zinc oxide (ZnO) can be used as the semiconductor substrate 201. Moreover, a template substrate made by growing a GaN crystal on a substrate different from the GaN substrate, such as a sapphire substrate can be also used.

Embodiment 3

The following describes a semiconductor light emitting element 300 according to Embodiment 3. In the present embodiment, a green (a wavelength of 520 nm) semiconductor laser using a hexagonal group III nitride semiconductor is used as an example of the semiconductor light emitting element 300.

Figure 15:
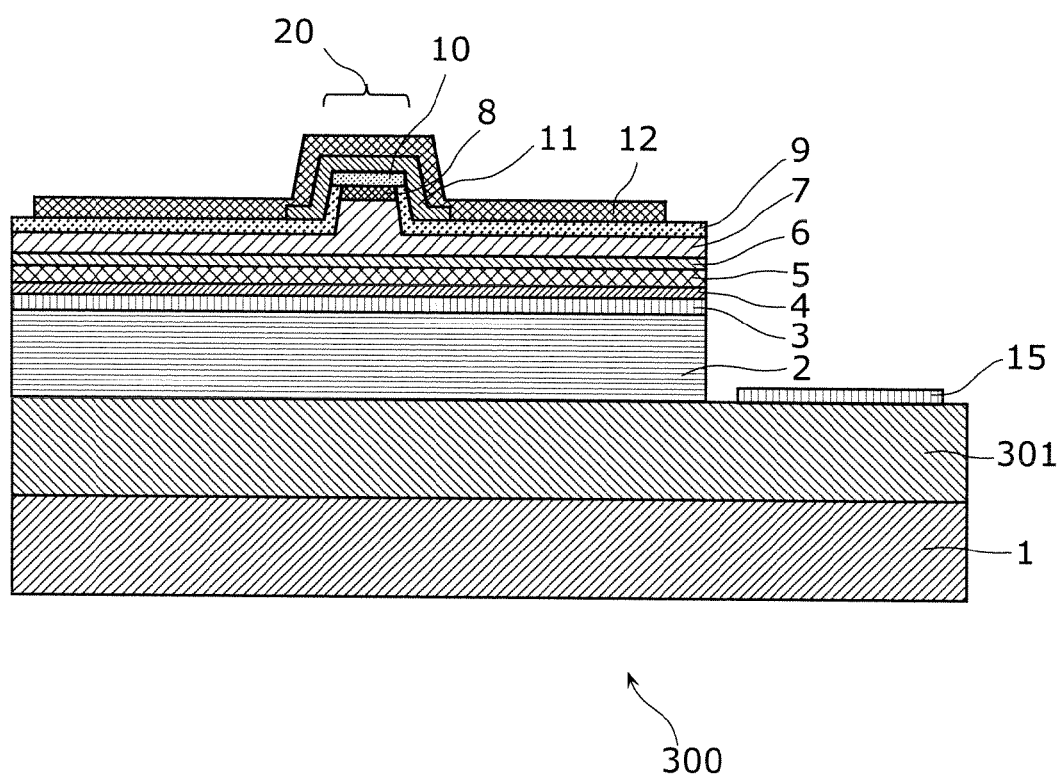
FIG. 15 illustrates a structure of a semiconductor light emitting element according to Embodiment 3.

FIG. 15 is a cross-sectional view of the semiconductor light emitting element 300 according to the present embodiment. It should be noted that identical reference sings have been used to designate identical elements that are common with Embodiment 1. Repeated explanation is omitted, and different points from Embodiment 1 are explained.

In the semiconductor light emitting element 100 according to Embodiment 1, the n-electrode 15 is formed on the bottom surface of the semiconductor substrate 1. In the semiconductor light emitting element 300 according to the present embodiment, an n-type clad layer 301 containing, for example, n-type GaN is provided between the substrate and the semiconductor superlattice layer 2, as a portion of the n-type layer of the semiconductor stacked structure. Moreover, the n-electrode 15 is formed on the side of the n-type clad layer 301 which is the same side where the semiconductor superlattice layer 2 is formed.

Even in this structure, a current (electrons) is injected from the two electrodes (the p-electrode 10 and the n-electrode 15) into the semiconductor superlattice layer 2 in the vertical direction (stacking direction). That is, a current path passing through the semiconductor superlattice layer 2 in the vertical direction (stacking direction) is formed between the two electrodes. When, in particular, an insulating substrate is used instead of a semiconductor substrate, this structure is effective since a current (electrons) can be easily injected into the semiconductor superlattice layer 2 in the vertical direction (stacking direction).

When the insulating substrate is used, the above structure easily allows a current (electrons) to be injected into the semiconductor superlattice layer 2 in the vertical direction (stacking direction).

It should be noted that also in the present embodiment as with Embodiment 1, preferably, the film thickness of AlInN (O) should be at most 5 nm. Moreover, preferably, the oxygen concentration of AlInN(O) should be at least $1\times10^{18}$ cm$^{-3}$. It should be noted that preferably, a period of the AlInN(O)/n-GaN superlattice layer, i.e., the total thickness of an AlInN(O) film and an n-GaN film should be less than 10 nm, more preferably, less than 5 nm.

Also in the present embodiment, the GaN-based substrate (e.g., GaN substrate and AlGaN substrate) belonging to the hexagonal system is used as the semiconductor substrate 1. However, other substrate which can grow a GaN-based material and contains, for example, silicon carbide (SiC), silicon (Si), sapphire (single crystal $Al_2O_3$), or zinc oxide (ZnO) can be used as the semiconductor substrate 1. Moreover, a template substrate made by growing GaN crystal on a substrate different from the GaN substrate, such as a sapphire substrate can be also used.

It should be noted that in the above description, a semiconductor laser having an emission wavelength in a green region is used as the semiconductor light emitting element in the present embodiment. A super luminescent diode in which the emission spectral bandwidth is extended by decreasing the reflectance of the front side, a speckle noise is reduced, and the emission wavelength is in the green region may be also used. Furthermore, by decreasing the ratio of In to the composition of the active layer to around 16%, a blue semiconductor laser or a super luminescent diode having a blue wavelength of 445 nm may be used.

The herein disclosed subject matter is to be considered descriptive and illustrative only, and the appended Claims are of a scope intended to cover and encompass not only the particular embodiment(s) disclosed, but also equivalent structures, methods, and/or uses.

Industrial Applicability

The semiconductor light emitting elements according to the present disclosure can be used in laser displays or backlight liquid crystal displays (LCD) and laser surgical knifes and used for welding, for example. Moreover, the semiconductor light emitting elements according to the present disclosure are useful for, for example, semiconductor light emitting elements using GaN-based compound semiconductors.

The invention claimed is:

1. A semiconductor light emitting element comprising:
an n-type layer containing a group III nitride semiconductor, an active layer, and a p-type layer,
wherein the n-type layer includes a semiconductor superlattice layer which is a stack of superlattice layers, the semiconductor superlattice layer having a structure in which group III nitride semiconductors A and group III nitride semiconductors B are alternately stacked, each of the group III nitride semiconductors A and each of the group III nitride semiconductors B being stacked in each of the superlattice layers,
a relationship Eg (A) >Eg (B) holds, where Eg (A) denotes a band gap of the group III nitride semiconductor A, and Eg (B) denotes a band gap of the group III nitride semiconductor B,
the group III nitride semiconductor A is a film containing AlInN, and the film contains oxygen (O) at a concentration of at least $1 \times 10^{18}$ cm$^{-3}$,
the group III nitride semiconductor A has a film thickness of at most 5 nm,
a current is injected in a stacking direction of the superlattice layers, and
in the semiconductor superlattice layer, a stack of the group III nitride semiconductor A and the group III nitride semiconductor B is repeatedly disposed at a period shorter than 5 nm.

2. The semiconductor light emitting element according to claim 1, wherein the group III nitride semiconductor B contains n-type GaN or n-type InGaN.

3. The semiconductor light emitting element according to claim 1, wherein the group III nitride semiconductor B contains oxygen (O) or silicon (Si).

4. The semiconductor light emitting element according to claim 1, wherein the n-type layer, the active layer, and the p-type layer are stacked on a substrate in stated order.

5. The semiconductor light emitting element according to claim 1, wherein the p-type layer, the active layer, and the n-type layer are stacked on a substrate in stated order.

6. The semiconductor light emitting element according to claim 4, wherein the substrate is a GaN substrate or a GaN template substrate.

7. The semiconductor light emitting element according to claim 1,
wherein the n-type layer includes an n-type distribution Bragg reflector in which first refractive nitride semiconductor films and a plurality of the semiconductor superlattice layers are alternately stacked,
the n-type distribution Bragg reflector satisfying:

$n1 > n2$ and $n1 \times d1 = n2 \times d2 = \frac{1}{4} \times \lambda$ where n1 denotes a refractive index of each of the first refractive index nitride semiconductor films,
d1 denotes a film thickness of each of the first refractive index nitride semiconductor films,
n2 denotes a refractive index of the semiconductor superlattice layer,
d2 denotes a total film thickness of the semiconductor superlattice layer in which the group III nitride semiconductors A and the group III nitride semiconductors B are alternately stacked, and
λ denotes an emission wavelength of the active layer.

* * * * *